United States Patent
Singh et al.

(10) Patent No.: US 12,334,232 B2
(45) Date of Patent: Jun. 17, 2025

(54) EXTERNAL COOLING SOLUTION FOR MOBILE COMPUTING DEVICES

(71) Applicant: Intel Corporation, Santa Clara, CA (US)

(72) Inventors: Navneet Kumar Singh, Bangalore (IN); Samarth ALva, Bangalore (IN); Raghavendra S. Kanivihalli, Bangalore (IN); Aiswarya M. Pious, Bangalore (IN); Samantha Rao, Bangalore (IN); Bijendra Singh, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 819 days.

(21) Appl. No.: 17/380,656

(22) Filed: Jul. 20, 2021

(65) Prior Publication Data
US 2021/0350952 A1 Nov. 11, 2021

(51) Int. Cl.
*H05K 7/20* (2006.01)
*G05B 15/02* (2006.01)
(Continued)

(52) U.S. Cl.
CPC .............. *H01B 7/421* (2013.01); *G05B 15/02* (2013.01); *G06F 1/203* (2013.01);
(Continued)

(58) Field of Classification Search
CPC ........ H01B 7/421; H01B 11/00; G05B 15/02; G06F 1/203; H05K 7/20136; H05K 7/20209
(Continued)

(56) References Cited

U.S. PATENT DOCUMENTS 8,208,250 B2   6/2012   Mongia
2006/0227516 A1 *  10/2006   Huang .................... G06F 1/203
                                              361/695

(Continued)

FOREIGN PATENT DOCUMENTS

DE   202015104404 U1   9/2015

OTHER PUBLICATIONS

EPO; Partial European Search Report issued in EP Patent Application No. 22161808.5, dated Sep. 9, 2022; 11 pages.
(Continued)

*Primary Examiner* — Zhengfu J Feng
(74) *Attorney, Agent, or Firm* — Alliance IP, LLC

(57) ABSTRACT

An air mover external to a mobile computing device provides enhanced cooling to the device by generating forced air delivered to the device via cooling channels connected to openings in the device chassis. If the mobile computing device is passively cooled (is a fanless device), the enhanced cooling can enable the device or device components to operate at a higher power consumption level without exceeding device/component thermal limits or for features that consume high amounts of power (e.g., fast charging) to be incorporated into the device. The air mover can be integrated into or attached to a cable that provides power to the mobile computing device. The air mover can be powered by the cable. The air mover can dynamically adjust the flow rate of the forced air based on device/component performance information (temperature, power consumption, current consumption) or operational state information of the device.

22 Claims, 11 Drawing Sheets

(51) Int. Cl.
  *G06F 1/20* (2006.01)
  *H01B 7/42* (2006.01)
  *H01B 11/00* (2006.01)

(52) U.S. Cl.
  CPC ..... *H05K 7/20136* (2013.01); *H05K 7/20209* (2013.01); *H01B 11/00* (2013.01)

(58) Field of Classification Search
  USPC .......................................................... 361/688
  See application file for complete search history.

(56) References Cited

U.S. PATENT DOCUMENTS

| | | | |
|---|---|---|---|
| 2007/0047199 A1* | 3/2007 | Tsutsui | G06F 1/203 361/679.48 |
| 2010/0259886 A1* | 10/2010 | Mongia | G06F 1/203 361/679.53 |
| 2012/0202373 A1* | 8/2012 | Klinghult | G06F 1/266 439/485 |
| 2017/0273214 A1* | 9/2017 | Casparian | G06F 1/203 |
| 2020/0080578 A1 | 3/2020 | Wang | |

OTHER PUBLICATIONS

EPO; Extended European Search Report issued in EP Patent Application 22161808.5, dated Dec. 15, 2022; 10 pages.

* cited by examiner

600

PROVIDE FORCED AIR TO MOBILE COMPUTING DEVICE BY AIR MOVER
VIA COOLING CHANNELS
610

RECEIVE MOBILE COMPUTING DEVICE PERFORMANCE INFORMATION OVER
DATA WIRES CARRIED BY CABLE CONNECTED TO MOBILE COMPUTING DEVICE
620

CONTROL FLOW RATE OF FORCED AIR BASED ON MOBILE COMPUTING DEVICE
PERFORMANCE INFORMATION
630

PROVIDE FORCED AIR TO MOBILE COMPUTING DEVICE BY AIR MOVER
VIA COOLING CHANNELS
710

RECEIVE MOBILE COMPUTING DEVICE PERFORMANCE INFORMATION OVER
DATA WIRES CARRIED BY CABLE CONNECTED TO MOBILE COMPUTING DEVICE
720

CONTROL FLOW RATE OF FORCED AIR BASED ON MOBILE COMPUTING DEVICE
OPERATIONAL STATE INFORMATION
730

EXTERNAL COOLING SOLUTION FOR MOBILE COMPUTING DEVICES

BACKGROUND

Some existing mobile computing devices utilize a passive cooling approach as a thermal management solution to achieve a sleek profile and quiet operation. These fanless devices can use heat pipes, heat sinks, vapor chambers, heat spreaders, and other passive cooling elements to dissipate heat generated by device components. Passive cooling approaches may not provide the same level of cooling as active cooling approaches, and as a result, passively cooled mobile computing devices may not be able to perform at the same performance level as actively cooled mobile computing devices due to the tighter thermal constraints that passive cooling approaches can place on device performance.

BRIEF DESCRIPTION OF THE DRAWINGS

FIG. 6 illustrates a second example method of controlling the flow rate of forced air provided to a mobile computing device.

DETAILED DESCRIPTION

Figure 1A:
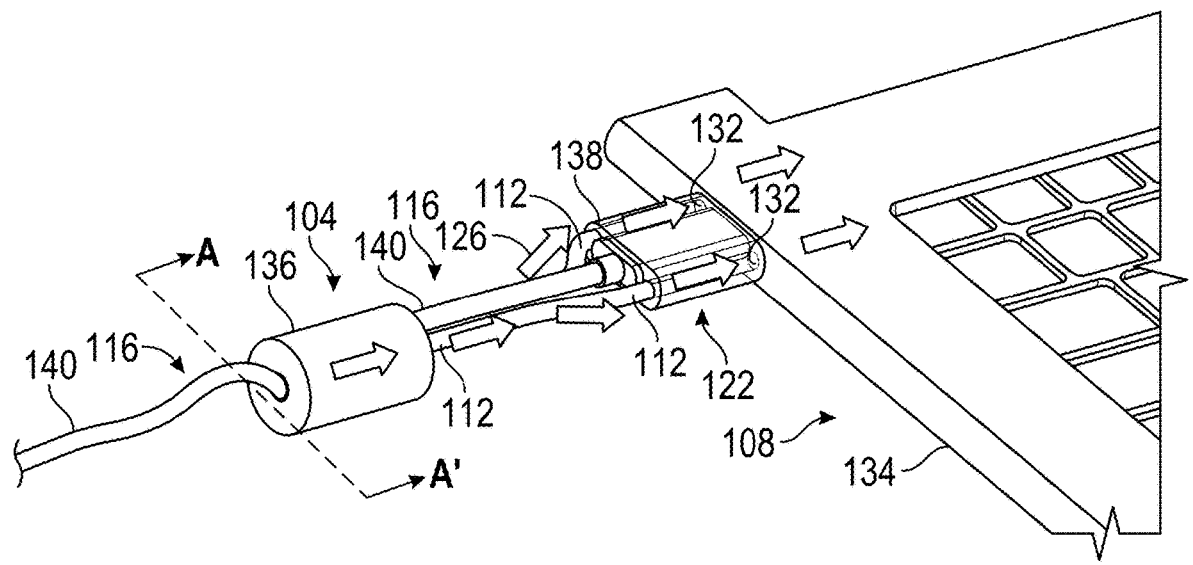
FIGS. 1A-1C illustrate perspective and cross-sectional views of an example air mover that can provide forced air to a mobile computing device.

The thermal constraints placed on mobile computing device performance by a passive cooling thermal management solution (e.g., heat pipes, heat spreaders, heat sinks, vapor chambers) can preclude the use of adaptive performance technologies that allow for the dynamic adjustment of device performance in such devices (e.g., Intel® Dynamic Thermal and Performance Framework (DTPF) and Intel® Dynamic Tuning Technology (DTT)). Even when a passively cooled mobile computing device is connected to an external power source, the performance of the device may not be able to be increased as an increase in power consumption may cause the device to exceed its thermal limits. The external cooling technologies described herein provide for the enhanced air cooling of computing devices. Passively cooled mobile computing devices in particular can take advantage of the disclosed technologies. The addition of the flow of forced air over heat-generating components in a passively cooled device can create a power budget margin that can be utilized to operate the device at a higher level of power consumption and remain within thermal limits. The enhanced air cooling is provided by an air mover located external to a computing device. The air mover can be integrated into or attached to a cable that provides power (and additionally, in some embodiments, data connections) to a computing device. The enhanced air cooling can dynamically adjust the amount of forced air supplied to the computing device based on the performance or operational state of the computing device. The increased cooling of mobile computing devices can further allow for more comfortable usage by a user. For example, a user who is using a laptop computer or tablet computing device that employs the technologies described herein may find the device more comfortable to use since the device may be less prone to overheating the user's lap due to the device operating at a lower temperature. That is, the power budget margin created by the enhanced air cooling is utilized to operate the device at a lower temperature rather than to increase its performance. Further, utilization of the enhanced air cooling technologies disclosed herein may allow for the incorporation of adaptive performance technologies, such as Intel® DTPF and DTT, into passively cooled mobile computing devices.

In the following description, specific details are set forth, but embodiments of the technologies described herein may be practiced without these specific details. Well-known circuits, structures, and techniques have not been shown in detail to avoid obscuring an understanding of this description. Phrases such as "an embodiment," "various embodiments," "some embodiments," and the like may include features, structures, or characteristics, but not every embodiment necessarily includes the particular features, structures, or characteristics.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact with each other and "coupled" may indicate elements co-operate or interact with each other, but they may or may not be in direct physical or electrical contact. Furthermore, the terms "comprising," "including," "having," and the like, as used with respect to embodiments of the present disclosure, are synonymous. Terms modified by the word "substantially" include arrangements, orientations, dimensions, spacings, or positions that vary slightly from the meaning of the unmodified term. For example, reference to a dimension that is substantially an indicated amount covers dimensions that vary within a few percent of the indicated amount.

As used herein, the term "integrated circuit component" refers to a packaged or unpacked integrated circuit product. A packaged integrated circuit component comprises one or more integrated circuits mounted on a package substrate. In one example, a packaged integrated circuit component contains one or more processor units mounted on a substrate, with an exterior surface of the substrate comprising a solder ball grid array (BGA). In one example of an unpackaged integrated circuit component, a single monolithic integrated circuit die comprises solder bumps attached to contacts on the die. The solder bumps allow the die to be directly attached to a printed circuit board. An integrated circuit component can comprise one or more of any computing system component described or referenced herein or any other computing system component, such as a processor unit (e.g., system-on-a-chip (SoC), processor core, graphics processor unit (GPU), accelerator), I/O controller, chipset processor, memory, or network interface controller.

Reference is now made to the drawings, which are not necessarily drawn to scale, wherein similar or same numbers may be used to designate same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

In the following description, for purposes of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modifications, equivalents, and alternatives within the scope of the claims.

Figure 1B:
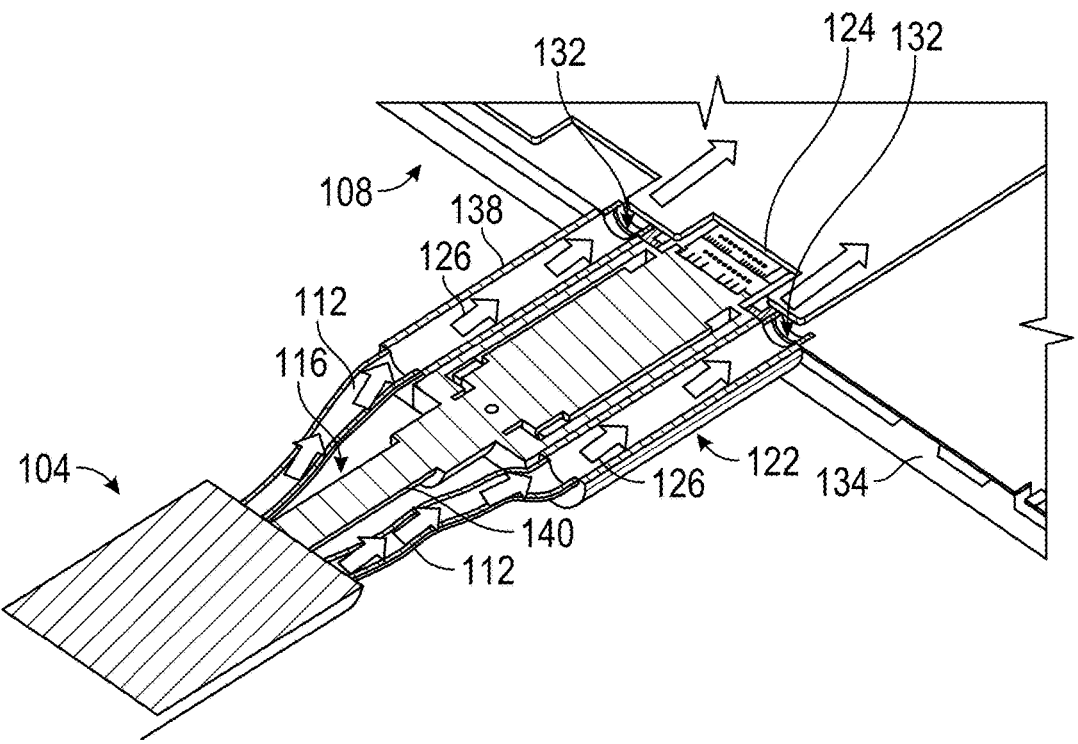
Figure 1C:
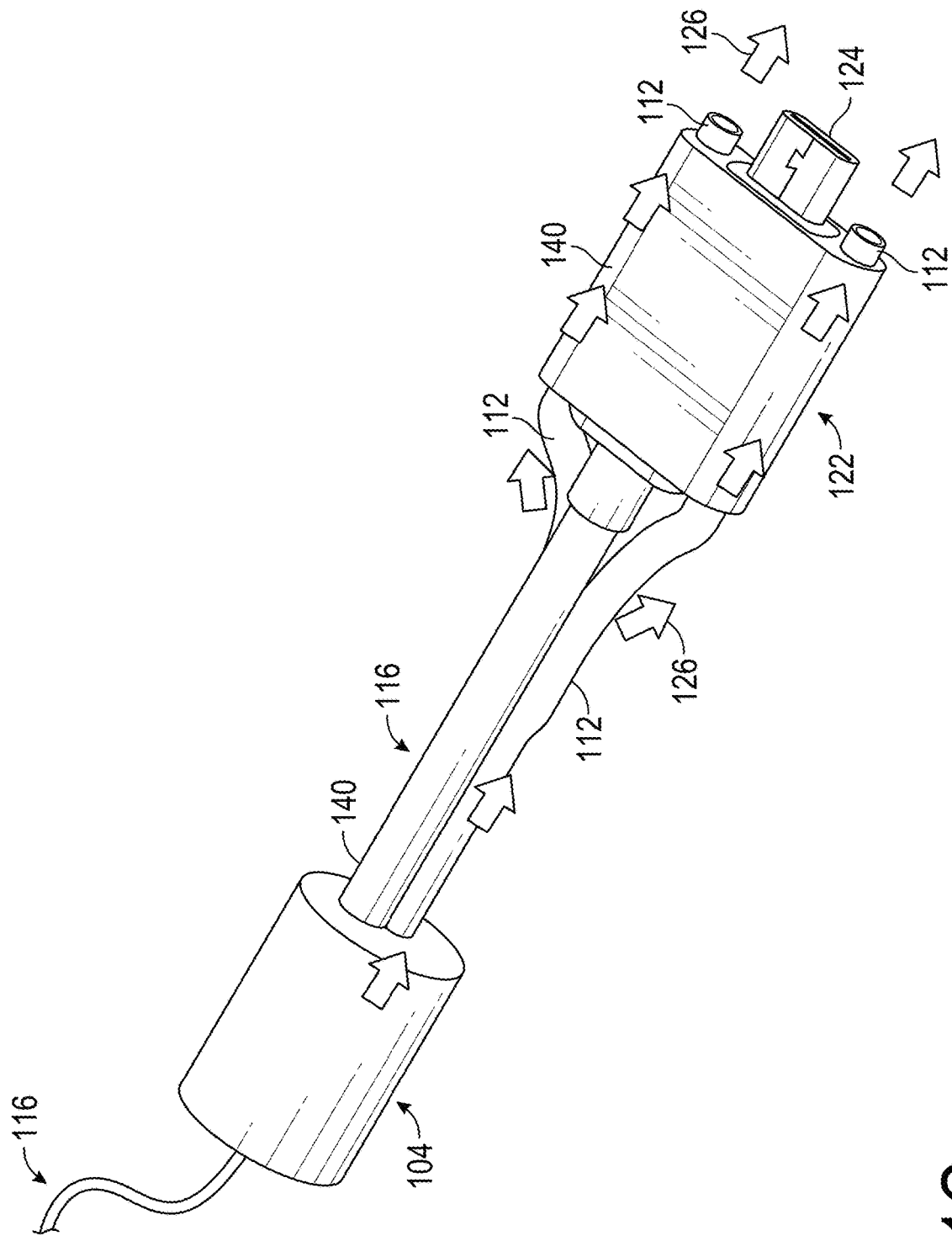

FIGS. 1A-1C illustrate perspective and cross-sectional views of an example external air mover that can provide forced air to a mobile computing device. FIG. 1A illustrates a first perspective view of an air mover 104 connected to a mobile computing device 108, FIG. 1B illustrates a perspective cross-sectional view of the air mover 104 taken along the line A-A' of FIG. 1A, and FIG. 1C illustrates a second perspective view of the air mover 104. The air mover 104 generates forced air and provides the forced air to the cooling channels 112, which deliver the forced air to the mobile computing device 108. The air mover 104 is integrated into a cable 116 that encloses (or carries) one or more wires (or lines) that provide power, ground, and/or data signals to the mobile computing device 108. A connector 122 connects the cooling channels 112 to cooling channel chassis openings 132 in a chassis 134 of the mobile computing device 108 and also connects the wires enclosed in the cable 116 to the device 108. The wires in the cable 116 are connected to the device 108 by an electrical connector 124 of the cable 116. The forced air flows through the cooling channels 112 and the mobile computing device 108 as indicated by arrows 126. After flowing through the cooling channels 112 and into the mobile computing device 108, the forced air can pass over one or more device components, such as an SoC, charging circuitry, or one or more other integrated circuit components to absorb heat generated by components. The heated forced air can exit the device 108 at one or more exhaust vents.

The air mover 104 can comprise a fan, blower, synthetic jet, or another component suitable for generating forced air. A portion of the cable 116 is enclosed by an air mover housing 136 and the air mover 104 is powered through a connection to one or more of the wires in the cable 116 that deliver power to the mobile computing device 108. An air mover can be considered to be integrated into a cable if wires carried by the cable pass through an air mover housing or if the air mover is connected to one or more wires enclosed by the cable to, for example, receive power or data. An air mover can be considered to be external to a cable if air mover housing is separate from and external to a housing of the cable (e.g., housing 140) and receives power in a manner other than being connected to a power wire carried by the cable. For example, the air mover can be powered by a power wire carried by a second cable. Although the air mover 104 is illustrated in FIG. 1A as being cylindrical and axially aligned with the cable 116, the air mover 104 can have any shape and can be oriented in any manner relative to the cable 116. The mobile computing device 108 can be any mobile computing device described or referenced herein, such as a laptop, tablet, or smartphone, or any other mobile computing device.

Figure 2:
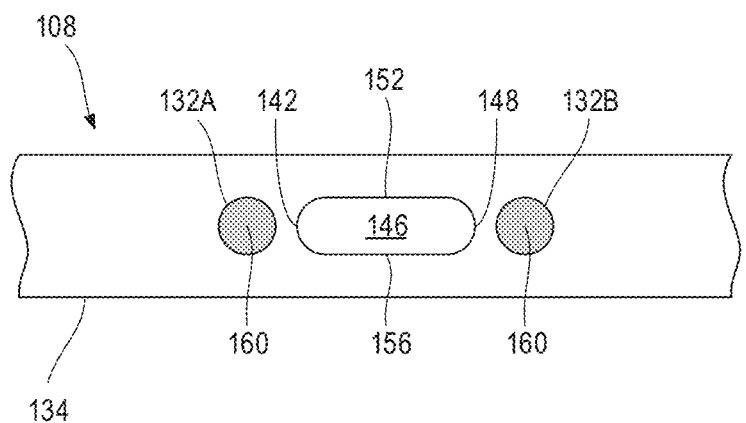
FIG. 2 shows example mobile computing device chassis openings to which a connector comprising cooling channels can connect.

FIG. 2 illustrates a side view of a portion of the mobile computing device chassis of FIGS. 1A-1B. The chassis 134 comprises an electrical connection opening 146 through which the electrical connector 124 of the connector 122 can be inserted to connect the electrical connector 124 to a corresponding connector of a mobile computing device. In some embodiments, the electrical connector 124 can be a Universal Serial Bus Type-C (USB-C) plug that connects to a USB-C receptacle of the mobile computing device 108. When the electrical connector 124 is plugged into the electrical connector opening 146, the cooling channels 112 align with and connect to the cooling channel chassis openings 132. Although two cooling channel chassis openings 132 are illustrated in FIGS. 1A-1B and 2, in other embodiments, the chassis 134 can comprise additional or fewer cooling channel chassis openings 132. A first cooling channel chassis opening 132A is located adjacent to a first edge or end 142 of the electrical connection opening 146 and a second cooling channel chassis opening 132B is located adjacent to a second edge or end 148 of the opening 146. In other embodiments, the cooling channel openings 132 can be located adjacent to additional or other edges or ends of the opening 146, such as a top edge or end 152 and a bottom edge or end 156. For example, in some embodiments, a chassis can comprise four cooling channel chassis openings, with one cooling channel chassis opening being adjacent to each of the end or edges 142, 148, 152, and 156 of the opening 146. In other embodiments, a chassis with two cooling channel chassis openings can be present, with the openings adjacent to the top and bottom edges 152 and 156. In some embodiments, more than one cooling channel chassis opening can be adjacent to an electrical connection chassis opening edge or end.

In some embodiments, the chassis 134 comprises spring-loaded doors 160 that open toward the interior of a mobile computing device to cover the cooling channel chassis openings 132 when cooling channels are not connected to the chassis openings 132. The doors 160 can aid in providing a more esthetically pleasing industrial design or keep dust and other debris from entering the mobile computing device 108. In some embodiments, elastomeric rings can be fitted to the cooling channel chassis openings 132 to prevent forced air from leaking from the cooling channels 112 to the outside environment when cooling channels 112 are connected.

Returning to FIGS. 1A-1C, the air mover 104 is positioned at a point along the cable 116 that is proximate to the end of the cable comprising the connector 122. The closer an air mover is positioned to the connector that connects to a computing device, the lower the resistance that the cooling channels 112 present to the forced air. Thus, the closer an air mover is located to a connector 122, the higher the flow rate the air mover 104 may be able to provide to a connected mobile computing device. In other embodiments, an air mover can be positioned at any point along a cable between the connectors located at the cable ends. The air mover 104 can tap into a power line of the cable at any point along the cable to power the air mover 104. The cooling channels 112 are external to the cable 116. That is, a cable housing 140 does not enclose the cooling channels 112. In other embodiments, the cooling channels 112 are internal to the cable 116 and the cable housing 140 encloses the cooling channels 112. A housing 138 of the connector 122 encloses a portion of the cooling channels 112 and the electrical connector 124.

The cable 116 can be of any length, comprise any number of wires, and comprise connectors of any type. In some embodiments, the cable 116 can be part of a power adapter that converts an external power supply signal (e.g., "wall power") to an input power supply signal suitable for use by the mobile computing device. In other embodiments, the cable 116 can be a charging cable, such as a USB, Ethernet, Thunderbolt, or HDMI (High-Definition Multimedia Interface) cable that delivers power to the mobile computing device in addition to providing data communication capabilities between the mobile computing device 108 and another computing device.

In some embodiments, the air mover 104 and the cooling channels 112 can be part of an air mover component that is separate from the cable 116. In such embodiments, the cooling channels 112 can connect to the mobile computing device 108 via a connector that is separate from a connector that connects wires carried by a cable to a mobile computing device. In some embodiments, the separate air mover component is releasably attachable to the cable and/or the cable connector. For example, the air mover component can be snapped to, clipped to, pulled over, or otherwise releasably attached to the cable and/or the cable connector. The air mover component can comprise one or more cooling channel connectors that house a portion of the cooling channels and releasably attach to a cable connector. Thus, in embodiments where a separate air mover component is releasably attachable to an electrical connector of a cable, a connector that connects the cooling channels and the wires carried by the cable to a mobile computing device can comprise a first connector portion (e.g., electrical connector 124) that connects the cable wires to the device and one or more second connector portions that connect the cooling channels the device, with the second connector portions being releasably attachable to the first connector portion.

Figure 3:
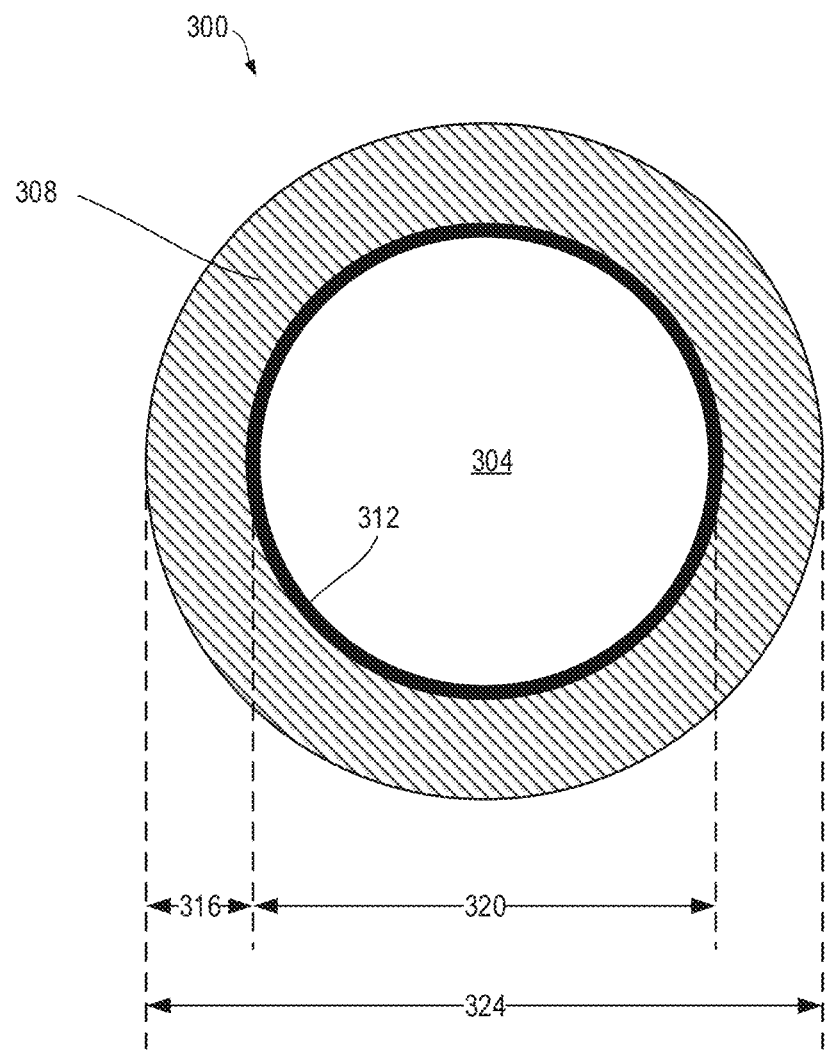
FIG. 3 illustrates a cross-sectional view of an example cooling channel.

FIG. 3 illustrates a cross-sectional view of an example cooling channel. The cooling channel 300 comprises an internal volume 304, a metal coil spring 308, and a shim 312 between the internal volume 304 and the metal coil spring 308. The shim 312 can provide an airtight structure to prevent leakage of forced air from the internal volume 304 to the external environment, have a smooth interior surface (e.g., a surface with a low surface roughness (Ra)) to present a low resistance to forced air flowing through the cooling channel 300, and provide stiffness to prevent sharp bends in the cooling channel 300. The metal coil spring 308 can reinforce the shim 312 and allow for some bending of the channel 300. The thickness of the shim 312, the thickness of the metal coil spring 308, and the inner and outer diameters of the cooling channel 300 can have any suitable values. In some embodiments, the shim 312 can have a thickness in the range of 0.05-0.10 mm. In some embodiments, the metal coil spring 308 can have a thickness 316 in the range of 0.5-0.8 mm. In some embodiments, the cooling channel 300 can have an inner diameter 320 of substantially 4.0 mm and an outer diameter 324 of substantially 5.0 mm.

The external cooling technologies disclosed herein can adjust the rate at which forced air flows through cooling channels based on information indicating the mobile computing device's performance (e.g., power consumption information, current consumption information, temperature information) or operational state, or by determining the amount of current flowing through a power line in a cable connected to the computing device.

Figure 4:
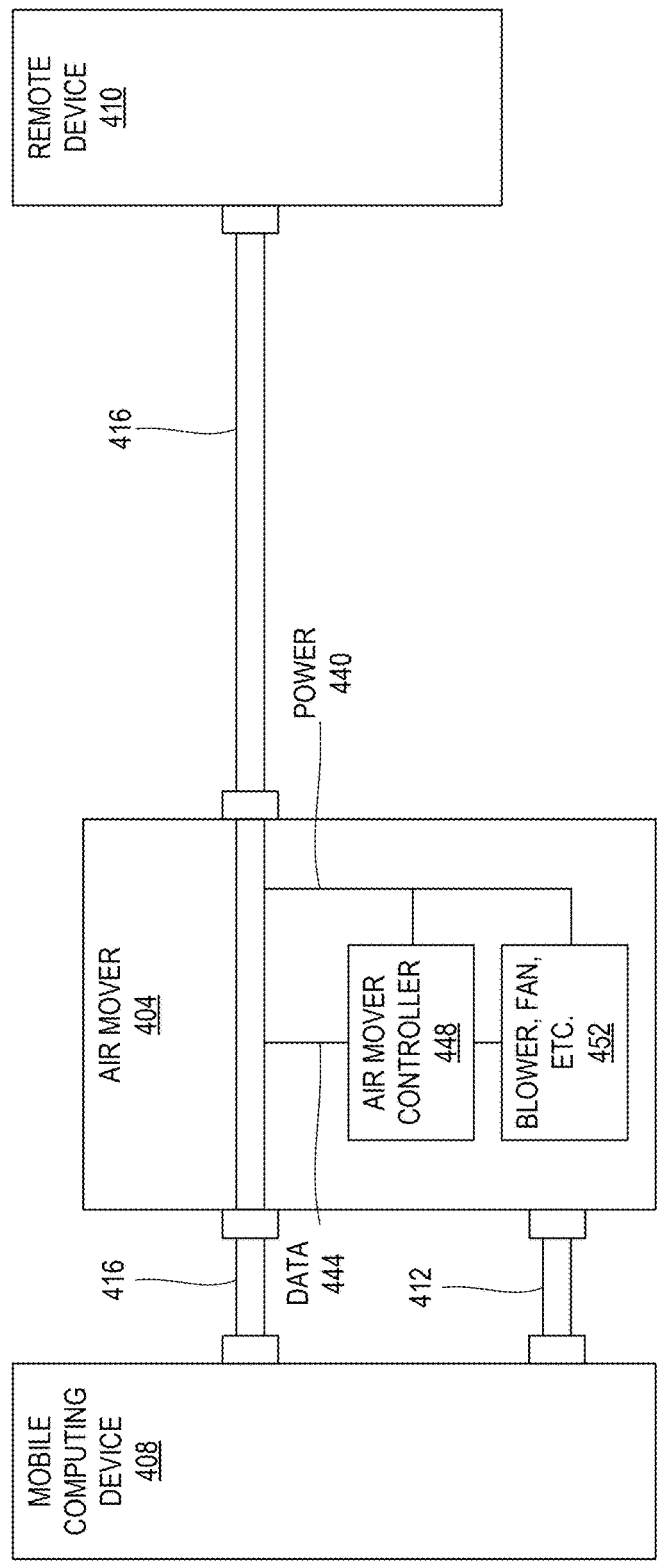
FIG. 4 is a block diagram of an example cable with an integrated air mover connected to a mobile computing device.

FIG. 4 is a block diagram of an example cable with an integrated air mover connected to a mobile computing device. The air mover 404 is integrated into a cable 416 that connects a mobile computing device 408 to a remote device 410 (e.g., power adapter, computing device). The air mover 404 is in-line with the cable 416 and is powered by a power line 440 that delivers power to the mobile computing device 408 and receives data carried on one or more data wires 444 that allow communication between the mobile computing device 408 and a remote device 410.

The air mover 404 comprises an air mover controller 448 and a blower, fan, or another component 452 capable of generating forced air that is provided to the device 408 by one or more cooling channels 412. The air mover controller 448 can control a flow rate of the generated forced air based on information received from the mobile computing device 408 over the data wires 444. For example, in embodiments where the forced air is generated by a blower or fan, the air mover controller 448 can control the flow rate of the forced air by controlling the speed at which the fan or blower spins. In embodiments where the flow rate of the forced air is based on a frequency at which a component vibrates, such as in piezoelectrically-driven synthetic jets, the air mover controller 448 can control the flow rate of the forced air by controlling the frequency at which the vibrating component vibrates. In some embodiments, the blower, fan, or another component 452 can be controlled via a pulse width modulated control signal or a variable supply voltage generated by the air mover controller 448. In some embodiments, the air mover controller 448 can comprise any of the processing units described herein.

In some embodiments, the air mover controller 448 can control the flow rate of the forced air based on information received over the one or more data wires 444, such as mobile computing device performance information (e.g., power consumption information, current consumption information, temperature information), mobile computing device operational state information, or user presence information. Mobile computing device power consumption information can comprise, for example, information indicating an amount of power consumed by the device 408 as a whole, the amount of power consumed by an individual component of the device 408 (such as an SoC or a charging circuit), or the amount of power consumed by multiple components of the device 408. Mobile computing device current consumption information can comprise, for example, information indicating an amount of current drawn by the device 408, a component of the device 408, or multiple components of the device 408. Mobile computing device temperature information can comprise, for example, information indicating an operating temperature of the device 408 or of a component of the device 408. The power consumption information, current consumption information, or temperature information can comprise a power consumption metric, current consumption metric, or temperature metric sampled on a periodic or another basis, a power consumption metric, current consumption metric, or temperature metric averaged over a period, or information derived from a power consumption metric, current consumption metric, or temperature metric on another suitable basis.

In some embodiments, the mobile computing device performance information can comprise critical temperature information. The critical temperature information can comprise information indicating a critical temperature that a component of the mobile computing device 408 (e.g., charging circuitry, SoC, another integrated circuit component) or the mobile computing device 408 is not to exceed. In such embodiments, the air mover controller 448 can determine a difference between the operating temperature of the mobile computing device 408 or a mobile computing device component and the critical temperature of the mobile computing device 408 or the mobile computing device component and control the flow rate of the forced air based on the temperature difference.

Mobile computing device operational state information can comprise information indicating that the device 408 or a device component is in a particular state, such as a processing unit or integrated circuit component being in a particular active state or idle state, or that a particular feature or mode of the device 408 is active. As used herein, the term "active state" when referring to the state of a processor unit refers to a state in which the processor unit is executing instructions. As used herein, the term "idle state" means a state in which a processor unit is not executing instructions. Modern processor units can have various sleep states in which they can be placed, with the varying idle states being distinguished by how much power the processor unit consumes in the idle state and idle state exit costs (e.g., how much time and how much power it takes for the processor unit to transition from the idle state to an active state).

Idle states for some existing processor units can be referred to as "C-states". In one example of a set of idle states, some Intel® processors can be placed in C1, C1E, C3, C6, C7, and C8 idle states. This is in addition to a "C0" state, which is the processor's active state. P-states can further describe the active state of some Intel® processors, with the various P-states indicating the processor's power supply voltage and operating frequency. The C1/C1E states are "auto halt" states in which all processes in a processor unit are performing a HALT or MWAIT instruction and the processor unit core clock is stopped. In the C1E state, the processor unit is operating in a state with its lowest frequency and supply voltage and with PLLs (phase-locked loops) still operating. In the C3 state, the processor unit's L1 (Level 1) and L2 (Level 2) caches are flushed to lower-level caches (e.g., L3 (Level 3) or LLC (last level cache)), the core clock and PLLs are stopped, and the processor unit operates at an operating voltage sufficient to allow it to maintain its state. In the C6 and deeper idle states, the processor unit stores its state to memory and its operating voltage is reduced to zero. As modern integrated circuit components can comprise multiple processor units, the individual processor units can be in their own idle states. These states can be referred to as C-states (core-states). Package C-states (PC-states) refer to idle states of integrated circuit components comprising multiple cores.

In some embodiments, the operational state information can comprise information indicating a physical configuration of the mobile computing device 408. For example, operational state information for a convertible mobile computing device can indicate that the mobile computing device is in a desktop configuration (in which the angle between a display portion of the device and a base portion of the device is within a first range of angles, the display portion rotated away from the base portion such that display portion is conveniently viewable by a user interacting with a keyboard of the base portion) or in a tent configuration (in which the angle between the display portion and the base portion is within a second range of angles that is greater than the first range of angles, the display portion rotated behind the base portion to act as a stand to support the display portion). In embodiments where the mobile computing device comprises a display portion that is separable from a base portion (such as an attachable keyboard), the operational state information can comprise information indicating that the device is in a tablet mode when the display portion is separated from the base portion. In some embodiments, if the operational state information indicates that the mobile computing device is in a desktop configuration, the air mover controller 448 can reduce the flow rate of the forced air or set the flow rate of the forced air to a minimum value or a lower value relative to other flow rate settings. In some embodiments, if the operational state information indicates that the mobile computing device is in a tent configuration, the air mover controller 448 can reduce the flow rate of the forced air or set the flow rate of the forced air to a minimum value or a lower value relative to other flow rate settings. In some embodiments, if the operational state information indicates that the mobile computing device is in a tablet configuration, the air mover controller 448 can increase the flow rate of the forced air or set the flow rate of the forced air to a maximum value or a higher value relative to other flow rate settings.

User presence information can indicate the presence of a user at the mobile computing device. User presence at a mobile computing device can be determined by, for example, an operating system of the mobile computing determining that input has been provided at an input device (e.g., keyboard, mouse, microphone) within a threshold period of time or by determining the presence of a user based on image data generated by a camera of a mobile computing device. If the user presence information indicates that no user is present, the air mover controller 448 can increase the flow rate of the forced air or set the flow rate of the forced air to a maximum value or a high value relative to other flow rate settings. Increasing the flow rate of the forced air if no user is present can serve, for example, to precool the mobile computing device prior to being used or to increase device performance to allow for quicker completion of one or more tasks, operations, or workloads executing on the device.

The component 452 of the air mover 404 that generates the forced air can be sized based on the resistance presented by the cooling channel 412 to the forced air. For example, based on analytical calculations, a cooling channel 25 cm in length and having an inner diameter of 3 mm has an estimated pressure drop along the length of the cooling channel of 2 inches of water (498 Pa). Some existing miniature air movers have a size of 40 mm×40 mm×28 mm and can provide 32 cubic feet per minute (CFM of air flow at 4 inches of water.

Thus, in embodiments where the operational information received by the air mover 404 comprising information indicating an active or idle state for a processing unit, package, or system (e.g., P-state, C-state, PC-state), the air mover can access a look-up table or other suitable data structure that indicates the control signal that the air mover controller 448 is to send to the component 452.

The air mover controller 448 can similarly control the component 452 based on operational state information indicating that a particular feature or mode of the device 408 is enabled. For example, in response to the air mover controller 448 receiving information indicating that a fast charging feature of the computing device 408 is enabled, the air mover controller 448 can access a look-up table or other data structure to retrieve information indicating the control signal that the air mover controller 448 is to send to the component 452. A fast charging mode of a computing device can be any charging mode in which a battery internal to the device 408 is charged at a faster rate than that in one or more other charging modes of the device 408. The amount of heat generated by the device's charging circuitry can scale with the rate at which the charging circuitry charges the battery. Fast charging rates that are achievable in some existing computing devices may not be achievable in passively cooled mobile computing devices due to thermal limitations.

In some embodiments, the air mover controller 448 can control the flow rate of the forced air based on current consumption information passed over one or more data lines in the cable in accordance with a cable or connector protocol (e.g., USB-C). For example, the air mover controller 448 can receive information being passed along one or more data lines of a cable in accordance with a cable or connector protocol indicating an amount of current being drawn by the mobile computing device 408, an amount of current being consumed by a charging component or charging circuitry of the device 408, and/or an amount of current being consumed by a component of the device 408.

In some embodiments, the air mover controller 448 can adjust a flow rate of the forced air based on air mover control information received from the mobile computing device 408. For example, the air mover control information can indicate that the air mover is not to provide forced air, is to be powered down, is to be powered up, or is to be provide forced air at a specified flow rate. The specified flow rate can be relative flow rate (e.g., low, medium, high; level 1, 2, 3, 4, 5) or a specific flow rate (e.g., a flow rate indicated in cubic feet per minute).

In some embodiments, the air mover controller 448 can control the forced air flow rate based on a measure of how much current is flowing through a power line carried by the cable 416. The current flowing through the power line can be used as a proxy for how much power is being consumed by the device 408. The measure of how much current is flowing through the power line carried by the cable 416 can be an analog or digital signal generated by current sensing circuitry located in the air mover 404. In some embodiments, the current sensing circuitry can comprise a current sensing resistor located in-line with a power wire carried by the cable 416 and the measure of how much current is flowing through the power line is a measure of how much current is flowing through the current sensing resistor as sensed or determined by the current sensing circuitry. In some embodiments, the air mover controller 448 can cease providing forced air based on the information received from the mobile computing device. For example, the air mover controller 448 can cease providing forced air if it receives operational state information indicating the mobile computing device is in an idle state.

Thus, by being able to adjust the flow rate of forced air provided to a mobile computing device based on the performance or operational state information of the mobile computing device, the technologies described herein provide a closed-loop dynamic cooling solution.

Figure 5:
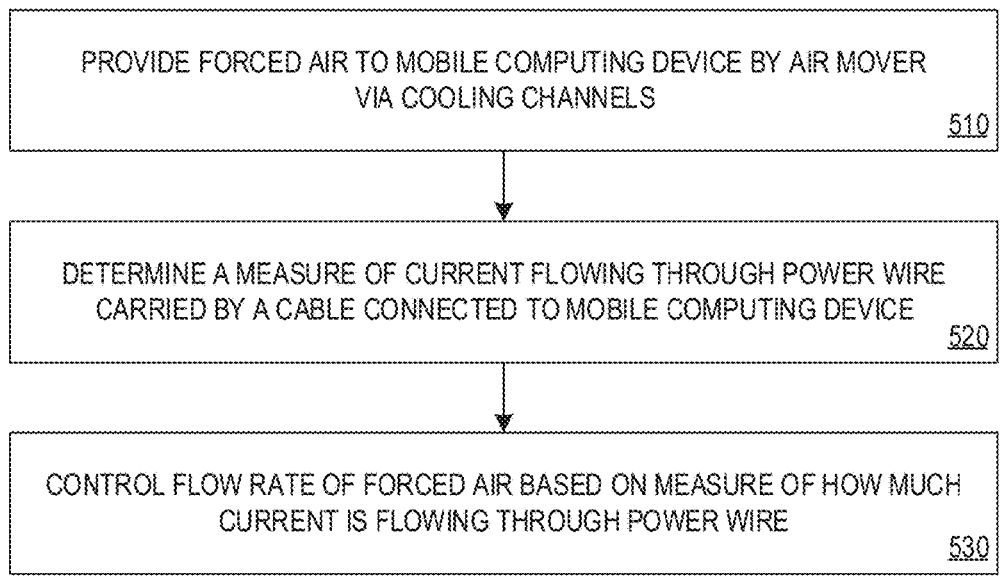
FIG. 5 illustrates a first example method of controlling the flow rate of forced air provided to a mobile computing device.

FIG. 5 illustrates a first example method of controlling the flow rate of forced air provided to a mobile computing device. At 510 of method 500, forced air is provided to a mobile computing device by an air mover via one or more cooling channels connected to the air mover and the mobile computing device. At 520, a measure of current flowing through a power wire carried by a cable connected to the mobile computing device is determined by the air mover. At 530, a flow rate of the forced air is controlled by the air mover based on the measure of how much current is flowing through the power wire.

FIG. 6 illustrates a second example method of controlling the flow rate of forced air provided to a mobile computing device. At 610 of method 600, forced air is provided to a mobile computing device by an air mover via one or more cooling channels connected to the air mover and the mobile computing device. At 620, mobile computing device performance information is received by the air mover over one or more data wires carried by a cable connected to the mobile computing device. At 630, a flow rate of the forced air is controlled by the air mover based on the mobile computing device performance information.

Figure 7:
FIG. 7 illustrates a third example method of controlling the flow rate of forced air provided to a mobile computing device.

FIG. 7 illustrates a third example method of controlling the flow rate of forced air provided to a mobile computing device. At 710 of method 700, forced air is provided to a mobile computing device by an air mover via one or more cooling channels connected to the air mover and the mobile computing device. At 720, mobile computing device performance information is received by the air mover over one or more data wires carried by a cable connected to the mobile computing device. At 730, a flow rate of the forced air is controlled by the air mover based on the mobile computing device operational state information.

Figure 8:
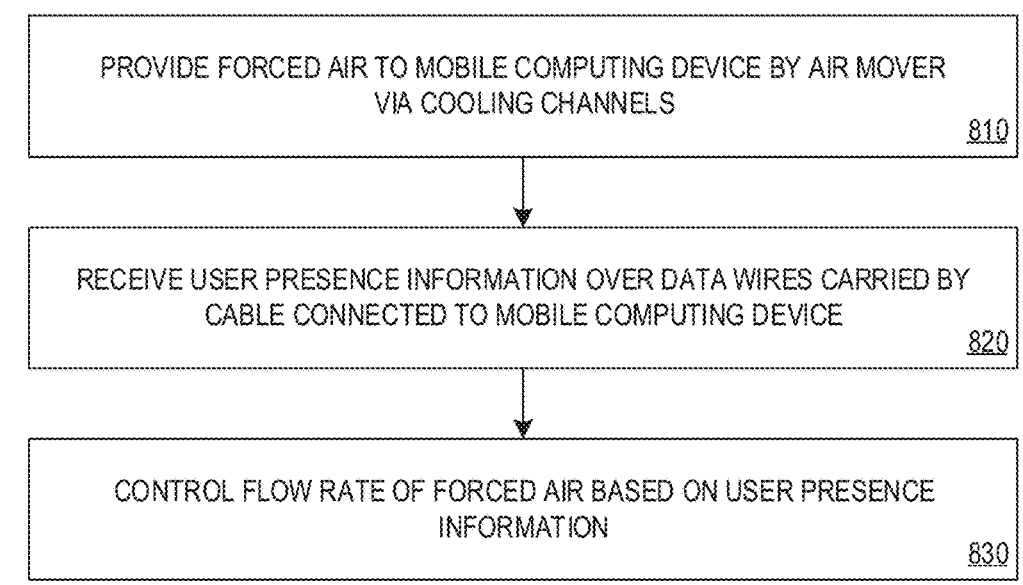
FIG. 8 illustrates a fourth example method of controlling the flow rate of forced air provided to a mobile computing device.

FIG. 8 illustrates a fourth example method of controlling the flow rate of forced air provided to a mobile computing device. At 810 of method 800, forced air is provided to a mobile computing device by an air mover via one or more cooling channels connected to the air mover and the mobile computing device. At 820, user presence information is received by the air mover over one or more data wires carried by a cable connected to the mobile computing device. At 830, a flow rate of the forced air is controlled by the air mover based on the user presence information.

The technologies described herein can be performed by or implemented in any of a variety of computing devices, including mobile computing devices (e.g., smartphones, handheld computers, tablet computers, laptop computers, portable gaming consoles, 2-in-1 convertible computers, portable all-in-one computers), non-mobile computing systems (e.g., desktop computers, servers, workstations, stationary gaming consoles, set-top boxes, smart televisions, rack-level computing solutions (e.g., blade, tray, or sled computing systems)), and embedded computing systems (e.g., computing systems that are part of a vehicle, smart home appliance, consumer electronics product or equipment, manufacturing equipment). As used herein, the term "computing system" includes computing devices and includes systems comprising multiple discrete physical components. In some embodiments, the computing systems are located in a data center, such as an enterprise data center (e.g., a data center owned and operated by a company and typically located on company premises), managed services data center (e.g., a data center managed by a third party on behalf of a company), a colocated data center (e.g., a data center in which data center infrastructure is provided by the data center host and a company provides and manages their own data center components (servers, etc.)), cloud data center (e.g., a data center operated by a cloud services provider that host companies applications and data), and an edge data center (e.g., a data center, typically having a smaller footprint than other data center types, located close to the geographic area that it serves).

Figure 9:
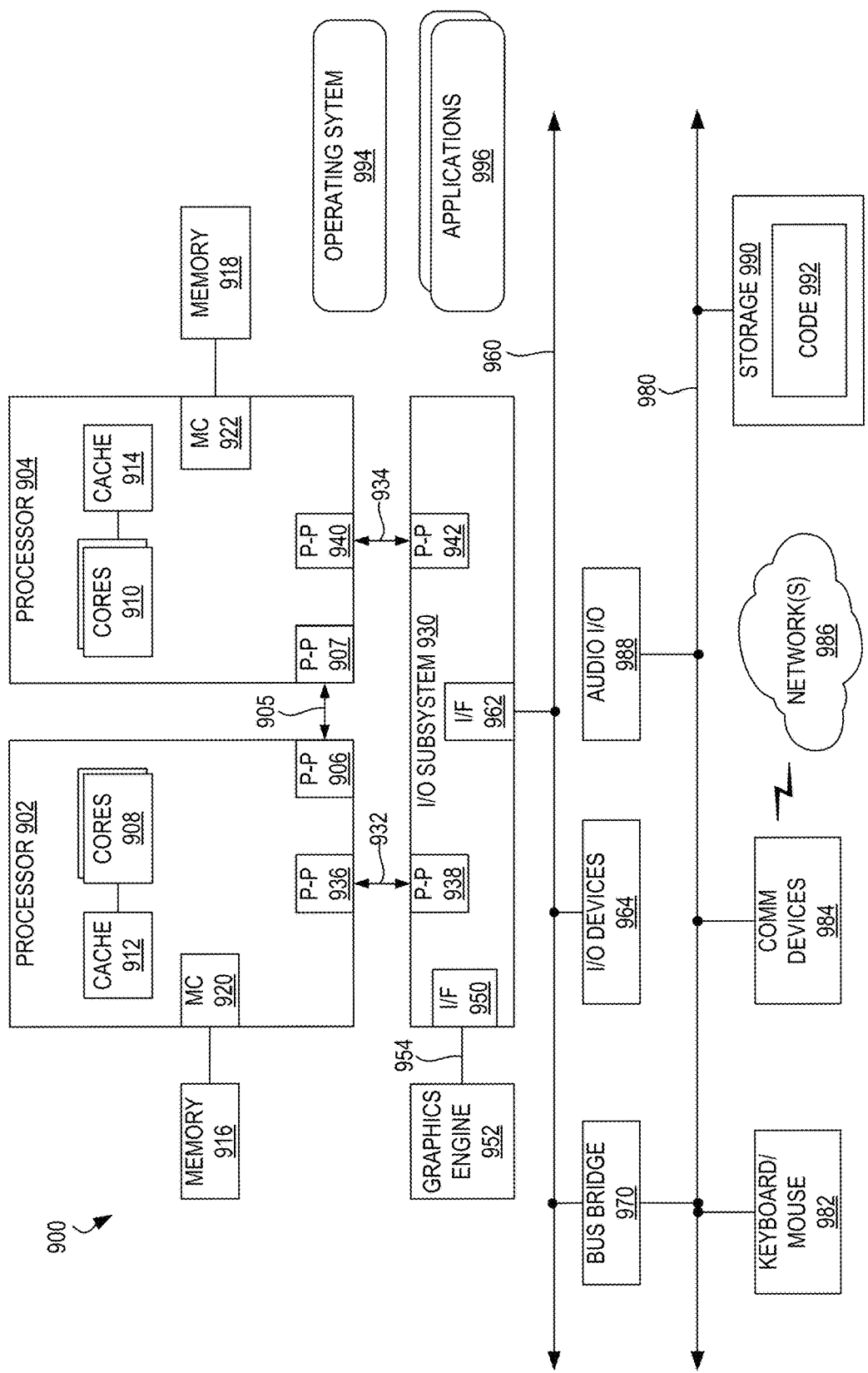
FIG. 9 is a block diagram of an exemplary mobile computing device to which enhanced cooling can be applied in accordance with any of the embodiments disclosed herein.

FIG. 9 is a block diagram of an example computing system in which technologies described herein may be implemented. Generally, components shown in FIG. 9 can communicate with other shown components, although not all connections are shown, for ease of illustration. The computing system 900 is a multiprocessor system comprising a first processor unit 902 and a second processor unit 904 comprising point-to-point (P-P) interconnects. A point-to-point (P-P) interface 906 of the processor unit 902 is coupled to a point-to-point interface 907 of the processor unit 904 via a point-to-point interconnection 905. It is to be understood that any or all of the point-to-point interconnects illustrated in FIG. 9 can be alternatively implemented as a multi-drop bus, and that any or all buses illustrated in FIG. 9 could be replaced by point-to-point interconnects.

The processor units 902 and 904 comprise multiple processor cores. Processor unit 902 comprises processor cores 908 and processor unit 904 comprises processor cores 910. Processor cores 908 and 910 can execute computer-executable instructions in a manner similar to that discussed below in connection with FIG. 10, or other manners.

Processor units 902 and 904 further comprise cache memories 912 and 914, respectively. The cache memories 912 and 914 can store data (e.g., instructions) utilized by one or more components of the processor units 902 and 904, such as the processor cores 908 and 910. The cache memories 912 and 914 can be part of a memory hierarchy for the computing system 900. For example, the cache memories 912 can locally store data that is also stored in a memory 916 to allow for faster access to the data by the processor unit 902. In some embodiments, the cache memories 912 and 914 can comprise multiple cache levels, such as level 1 (L1), level 2 (L2), level 3 (L3), level 4 (L4) and/or other caches or cache levels. In some embodiments, one or more levels of cache memory (e.g., L2, L3, L4) can be shared among multiple cores in a processor unit or among multiple processor units in an integrated circuit component. In some embodiments, the last level of cache memory on an integrated circuit component can be referred to as a last level cache (LLC). One or more of the higher levels of cache levels (the smaller and faster caches) in the memory hierarchy can be located on the same integrated circuit die as a processor core and one or more of the lower cache levels (the larger and slower caches) can be located on an integrated circuit dies that are physically separate from the processor core integrated circuit dies.

Although the computing system 900 is shown with two processor units, the computing system 900 can comprise any number of processor units. Further, a processor unit can comprise any number of processor cores. A processor unit can take various forms such as a central processing unit (CPU), a graphics processing unit (GPU), general-purpose GPU (GPGPU), accelerated processing unit (APU), field-programmable gate array (FPGA), neural network processing unit (NPU), data processor unit (DPU), accelerator (e.g., graphics accelerator, digital signal processor (DSP), compression accelerator, artificial intelligence (AI) accelerator), controller, or other types of processing units. As such, the processor unit can be referred to as an XPU (or xPU). Further, a processor unit can comprise one or more of these various types of processing units. In some embodiments, the computing system comprises one processor unit with multiple cores, and in other embodiments, the computing system comprises a single processor unit with a single core. As used herein, the terms "processor unit" and "processing unit" can refer to any processor, processor core, component, module, engine, circuitry, or any other processing element described or referenced herein.

In some embodiments, the computing system 900 can comprise one or more processor units that are heterogeneous or asymmetric to another processor unit in the computing system. There can be a variety of differences between the processing units in a system in terms of a spectrum of metrics of merit including architectural, microarchitectural, thermal, power consumption characteristics, and the like. These differences can effectively manifest themselves as asymmetry and heterogeneity among the processor units in a system.

The processor units 902 and 904 can be located in a single integrated circuit component (such as a multi-chip package (MCP) or multi-chip module (MCM)) or they can be located in separate integrated circuit components. An integrated circuit component comprising one or more processor units can comprise additional components, such as embedded DRAM, stacked high bandwidth memory (HBM), shared cache memories (e.g., L3, L4, LLC), input/output (I/O) controllers, or memory controllers. Any of the additional components can be located on the same integrated circuit die as a processor unit, or on one or more integrated circuit dies separate from the integrated circuit dies comprising the processor units. In some embodiments, these separate integrated circuit dies can be referred to as "chiplets". In some embodiments where there is heterogeneity or asymmetry among processor units in a computing system, the heterogeneity or asymmetric can be among processor units located in the same integrated circuit component. In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Processor units 902 and 904 further comprise memory controller logic (MC) 920 and 922. As shown in FIG. 9, MCs 920 and 922 control memories 916 and 918 coupled to the processor units 902 and 904, respectively. The memories 916 and 918 can comprise various types of volatile memory (e.g., dynamic random-access memory (DRAM), static random-access memory (SRAM)) and/or non-volatile memory (e.g., flash memory, chalcogenide-based phase-change non-volatile memories), and comprise one or more layers of the memory hierarchy of the computing system. While MCs 920 and 922 are illustrated as being integrated into the processor units 902 and 904, in alternative embodiments, the MCs can be external to a processor unit.

Processor units 902 and 904 are coupled to an Input/Output (I/O) subsystem 930 via point-to-point interconnections 932 and 934. The point-to-point interconnection 932 connects a point-to-point interface 936 of the processor unit 902 with a point-to-point interface 938 of the I/O subsystem 930, and the point-to-point interconnection 934 connects a point-to-point interface 940 of the processor unit 904 with a point-to-point interface 942 of the I/O subsystem 930. Input/Output subsystem 930 further includes an interface 950 to couple the I/O subsystem 930 to a graphics engine 952. The I/O subsystem 930 and the graphics engine 952 are coupled via a bus 954.

The Input/Output subsystem 930 is further coupled to a first bus 960 via an interface 962. The first bus 960 can be a Peripheral Component Interconnect Express (PCIe) bus or any other type of bus. Various I/O devices 964 can be coupled to the first bus 960. A bus bridge 970 can couple the first bus 960 to a second bus 980. In some embodiments, the second bus 980 can be a low pin count (LPC) bus. Various devices can be coupled to the second bus 980 including, for example, a keyboard/mouse 982, audio I/O devices 988, and a storage device 990, such as a hard disk drive, solid-state drive, or another storage device for storing computer-executable instructions (code) 992 or data. The code 992 can comprise computer-executable instructions for performing methods described herein. Additional components that can be coupled to the second bus 980 include communication device(s) 984, which can provide for communication between the computing system 900 and one or more wired or wireless networks 986 (e.g. Wi-Fi, cellular, or satellite networks) via one or more wired or wireless communication links (e.g., wire, cable, Ethernet connection, radio-frequency (RF) channel, infrared channel, Wi-Fi channel) using one or more communication standards (e.g., IEEE 902.11 standard and its supplements).

In embodiments where the communication devices 984 support wireless communication, the communication devices 984 can comprise wireless communication components coupled to one or more antennas to support communication between the computing system 900 and external devices. The wireless communication components can support various wireless communication protocols and technologies such as Near Field Communication (NFC), IEEE 1002.11 (Wi-Fi) variants, WiMax, Bluetooth, Zigbee, 4G Long Term Evolution (LTE), Code Division Multiplexing Access (CDMA), Universal Mobile Telecommunication System (UMTS) and Global System for Mobile Telecommunication (GSM), and 5G broadband cellular technologies. In addition, the wireless modems can support communication with one or more cellular networks for data and voice communications within a single cellular network, between cellular networks, or between the computing system and a public switched telephone network (PSTN).

The system 900 can comprise removable memory such as flash memory cards (e.g., SD (Secure Digital) cards), memory sticks, Subscriber Identity Module (SIM) cards). The memory in system 900 (including caches 912 and 914, memories 916 and 918, and storage device 990) can store data and/or computer-executable instructions for executing an operating system 994 and application programs 996. Example data includes web pages, text messages, images, sound files, and video data to be sent to and/or received from one or more network servers or other devices by the system 900 via the one or more wired or wireless networks 986, or for use by the system 900. The system 900 can also have access to external memory or storage (not shown) such as external hard drives or cloud-based storage.

The operating system 994 can control the allocation and usage of the components illustrated in FIG. 9 and support the one or more application programs 996. The application programs 996 can include common computing system applications (e.g., email applications, calendars, contact managers, web browsers, messaging applications) as well as other computing applications.

The computing system 900 can support various additional input devices, such as a touchscreen, microphone, monoscopic camera, stereoscopic camera, trackball, touchpad, trackpad, proximity sensor, light sensor, electrocardiogram (ECG) sensor, PPG (photoplethysmogram) sensor, galvanic skin response sensor, and one or more output devices, such as one or more speakers or displays. Other possible input and output devices include piezoelectric and other haptic I/O devices. Any of the input or output devices can be internal to, external to, or removably attachable with the system 900. External input and output devices can communicate with the system 900 via wired or wireless connections.

In addition, the computing system 900 can provide one or more natural user interfaces (NUIs). For example, the operating system 994 or applications 996 can comprise speech recognition logic as part of a voice user interface that allows a user to operate the system 900 via voice commands. Further, the computing system 900 can comprise input devices and logic that allows a user to interact with computing the system 900 via body, hand, or face gestures.

The system 900 can further include at least one input/output port comprising physical connectors (e.g., USB, IEEE 1394 (FireWire), Ethernet, RS-232), a rechargeable battery, charging circuitry to charge the battery, a global satellite navigation system (GNSS) receiver (e.g., GPS receiver); a gyroscope; an accelerometer; and/or a compass. A GNSS receiver can be coupled to a GNSS antenna. The computing system 900 can further comprise one or more additional antennas coupled to one or more additional receivers, transmitters, and/or transceivers to enable additional functions.

In addition to those already discussed, integrated circuit components, integrated circuit constituent components, and other components in the computing system 994 can communicate with interconnect technologies such as Intel® QuickPath Interconnect (QPI), Intel® Ultra Path Interconnect (UPI), Computer Express Link (CXL), cache coherent interconnect for accelerators (CCIX®), serializer/deserializer (SERDES), Nvidia® NVLink, ARM Infinity Link, Gen-Z, or Open Coherent Accelerator Processor Interface (OpenCAPI). Other interconnect technologies may be used and a computing system 994 may utilize more or more interconnect technologies.

It is to be understood that FIG. 9 illustrates only one example computing system architecture. Computing systems based on alternative architectures can be used to implement technologies described herein. For example, instead of the processors 902 and 904 and the graphics engine 952 being located on discrete integrated circuits, a computing system can comprise an SoC (system-on-a-chip) integrated circuit incorporating multiple processors, a graphics engine, and additional components. Further, a computing system can connect its constituent component via bus or point-to-point configurations different from that shown in FIG. 9. Moreover, the illustrated components in FIG. 9 are not required or all-inclusive, as shown components can be removed and other components added in alternative embodiments.

Figure 10:
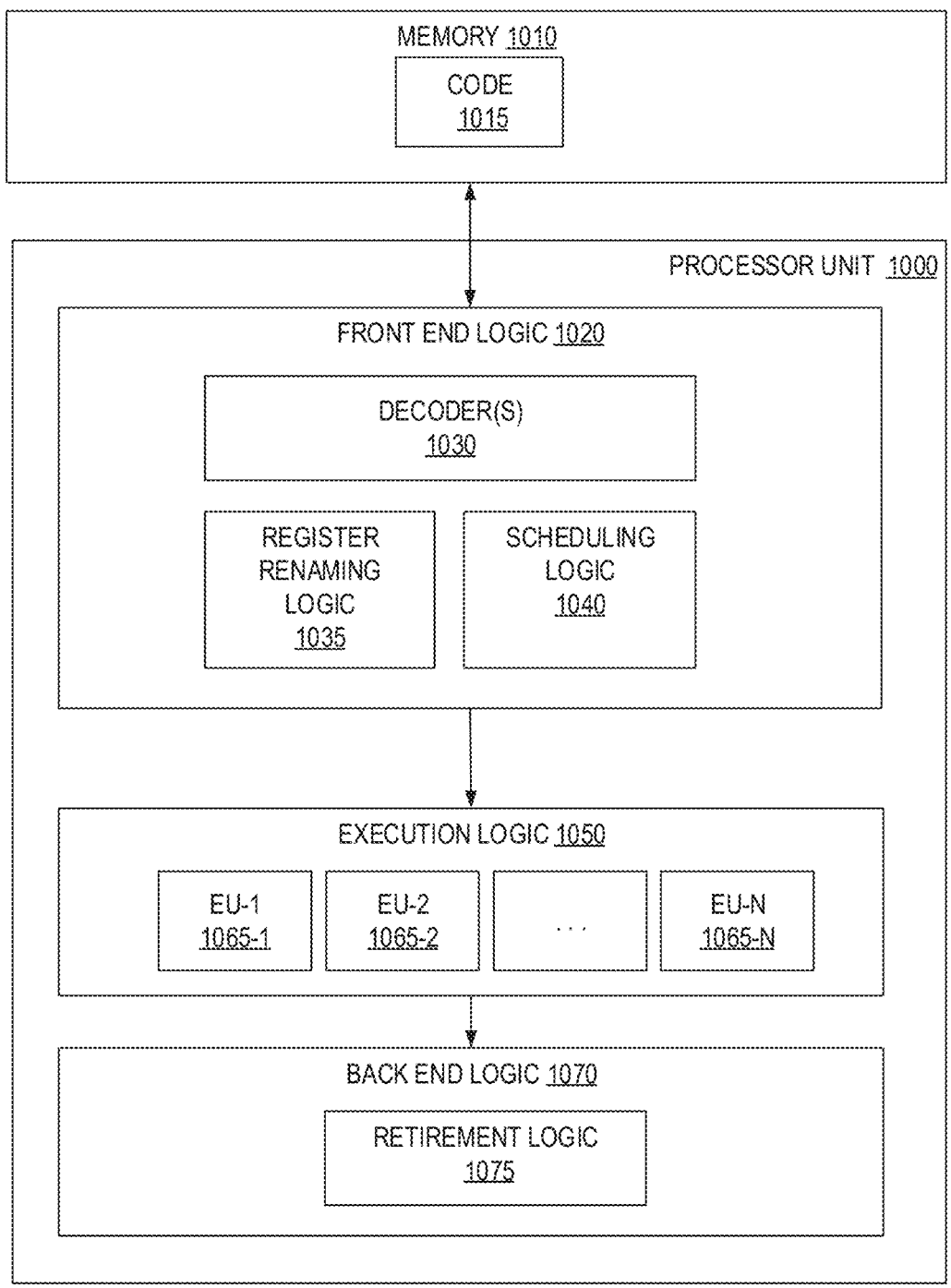
FIG. 10 is a block diagram of an exemplary processor unit that can execute instructions as part of implementing technologies described herein.

FIG. 10 is a block diagram of an example processor unit 1000 to execute computer-executable instructions as part of implementing technologies described herein. The processor unit 1000 can be a single-threaded core or a multithreaded core in that it may include more than one hardware thread context (or "logical processor") per processor unit.

FIG. 10 also illustrates a memory 1010 coupled to the processor unit 1000. The memory 1010 can be any memory described herein or any other memory known to those of skill in the art. The memory 1010 can store computer-executable instructions 1015 (code) executable by the processor unit 1000.

The processor unit comprises front-end logic 1020 that receives instructions from the memory 1010. An instruction can be processed by one or more decoders 1030. The decoder 1030 can generate as its output a micro-operation such as a fixed width micro operation in a predefined format, or generate other instructions, microinstructions, or control signals, which reflect the original code instruction. The front-end logic 1020 further comprises register renaming logic 1035 and scheduling logic 1040, which generally allocate resources and queues operations corresponding to converting an instruction for execution.

The processor unit 1000 further comprises execution logic 1050, which comprises one or more execution units (EUs) 1065-1 through 1065-N. Some processor unit embodiments can include a number of execution units dedicated to specific functions or sets of functions. Other embodiments can include only one execution unit or one execution unit that can perform a particular function. The execution logic 1050 performs the operations specified by code instructions. After completion of execution of the operations specified by the code instructions, back-end logic 1070 retires instructions using retirement logic 1075. In some embodiments, the processor unit 1000 allows out of order execution but requires in-order retirement of instructions. Retirement logic 1075 can take a variety of forms as known to those of skill in the art (e.g., re-order buffers or the like).

The processor unit 1000 is transformed during execution of instructions, at least in terms of the output generated by the decoder 1030, hardware registers and tables utilized by the register renaming logic 1035, and any registers (not shown) modified by the execution logic 1050.

Software and firmware may be embodied as instructions and/or data stored on non-transitory computer-readable storage media. As used herein, the term "circuitry" can comprise, singly or in any combination, non-programmable (hardwired) circuitry, programmable circuitry such as processor units, state machine circuitry, and/or firmware that stores instructions executable by programmable circuitry. A computing system referred to as being programmed to perform a method can be programmed to perform the method via software, hardware, firmware, or combinations thereof.

Any of the disclosed methods (or a portion thereof) can be implemented as computer-executable instructions or a computer program product. Such instructions can cause a computing system or one or more processor units capable of executing computer-executable instructions to perform any of the disclosed methods. As used herein, the term "computer" refers to any computing system, device, or machine described or mentioned herein as well as any other computing system, device, or machine capable of executing instructions. Thus, the term "computer-executable instruction" refers to instructions that can be executed by any computing system, device, or machine described or mentioned herein as well as any other computing system, device, or machine capable of executing instructions.

The computer-executable instructions or computer program products as well as any data created and/or used during implementation of the disclosed technologies can be stored on one or more tangible or non-transitory computer-readable storage media, such as volatile memory (e.g., DRAM, SRAM), non-volatile memory (e.g., flash memory, chalcogenide-based phase-change non-volatile memory) optical media discs (e.g., DVDs, CDs), and magnetic storage (e.g., magnetic tape storage, hard disk drives). Computer-readable storage media can be contained in computer-readable storage devices such as solid-state drives, USB flash drives, and memory modules. Alternatively, any of the methods disclosed herein (or a portion) thereof may be performed by hardware components comprising non-programmable circuitry. In some embodiments, any of the methods herein can be performed by a combination of non-programmable hardware components and one or more processing units executing computer-executable instructions stored on computer-readable storage media.

The computer-executable instructions can be part of, for example, an operating system of the computing system, an application stored locally to the computing system, or a remote application accessible to the computing system (e.g., via a web browser). Any of the methods described herein can be performed by computer-executable instructions performed by a single computing system or by one or more networked computing systems operating in a network environment. Computer-executable instructions and updates to the computer-executable instructions can be downloaded to a computing system from a remote server.

Further, it is to be understood that implementation of the disclosed technologies is not limited to any specific computer language or program. For instance, the disclosed technologies can be implemented by software written in C++, C#, Java, Perl, Python, JavaScript, Adobe Flash, C#, assembly language, or any other programming language. Likewise, the disclosed technologies are not limited to any particular computer system or type of hardware.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, cable (including fiber optic cable), magnetic communications, electromagnetic communications (including RF, microwave, ultrasonic, and infrared communications), electronic communications, or other such communication means.

As used in this application and the claims, a list of items joined by the term "and/or" can mean any combination of the listed items. For example, the phrase "A, B and/or C" can mean A; B; C; A and B; A and C; B and C; or A, B and C. As used in this application and the claims, a list of items joined by the term "at least one of" can mean any combination of the listed terms. For example, the phrase "at least one of A, B or C" can mean A; B; C; A and B; A and C; B and C; or A, B, and C. Moreover, as used in this application and the claims, a list of items joined by the term "one or more of" can mean any combination of the listed terms. For example, the phrase "one or more of A, B and C" can mean A; B; C; A and B; A and C; B and C; or A, B, and C.

The disclosed methods, apparatuses, and systems are not to be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present or problems be solved.

Theories of operation, scientific principles, or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

Although the operations of some of the disclosed methods are described in a particular, sequential order for convenient presentation, it is to be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

The following examples pertain to additional embodiments of technologies disclosed herein.

Example 1 is an apparatus comprising: a cable comprising a plurality of wires; one or more cooling channels external to the cable; an air mover connected to the one or more cooling channels, the air mover to generate forced air and provide the forced air to the cooling channels; and a connector located at an end of the cable to connect the wires and the cooling channels to a mobile computing device.

Example 2 comprises the apparatus of Example 1, wherein the air mover is integrated into the cable.

Example 3 comprises the apparatus of Example 1, wherein the air mover is external to the cable.

Example 4 comprises the apparatus of any one of Examples 1-3, wherein the end of the cable is a first end of the cable and the air mover is positioned at a point along the cable between the first end of the cable and a second end of the cable.

Example 5 comprises the apparatus of any one of Examples 1-4, wherein the connector is a first connector and the end is a first end of the cable, the air mover connected to a power wire of the plurality of wires at a point along the cable between the first connector and a second connector located at a second end of the cable.

Example 6 comprises the apparatus of any one of Examples 1-5, wherein the cooling channels are internal to the cable.

Example 7 comprises the apparatus of any one of Examples 1-6, wherein the air mover is releasably attachable to the cable.

Example 8 comprises the apparatus of Example any one of Examples 1-7, wherein the connector comprises a first connector portion that encloses the wires and one or more second connector portions that enclose the cooling channels, the one or more second connector portions releasably attachable to the first connector portion.

Example 9 comprises the apparatus of Example any one of Examples 1-9, further comprising an air mover controller to control a flow rate of the forced air generated by the air mover through the cooling channels.

Example 10 comprises the apparatus of Example 9, further comprising current sensing circuitry, the air mover controller to control the flow rate of the forced air based on a measure of how much current is flowing through a power wire of the plurality of wires provided by the current sensing circuitry.

Example 11 comprises the apparatus of Example 10, wherein the current sensing circuitry comprises a current sensing resistor in-line with the power wire, the measure of how much current is flowing through the power wire provided by the current sensing circuitry indicating an amount of current flowing through the current sensing resistor.

Example 12 comprises the apparatus of Example 9, wherein the cable further comprises one or more data wires, the air mover controller to receive mobile computing device power consumption information over the one or more data wires, the air mover controller to control the flow rate of the forced air based on the mobile computing device power consumption information.

Example 13 comprises the apparatus of Example 9, wherein the cable further comprises one or more data wires, the air mover controller to receive mobile computing device current consumption information over the one or more data wires, the air mover controller to control the flow rate of the forced air based on the mobile computing device current consumption information.

Example 14 comprises the apparatus of Example 13, wherein the mobile computing device current consumption information indicates an amount of current drawn by charging circuitry of the mobile computing device.

Example 15 comprises the apparatus of Example 13, wherein the mobile computing device current consumption information indicates an amount of current drawn by a system-on-a-chip (SoC) of the mobile computing device.

Example 16 comprises the apparatus of Example 9, wherein the cable further comprises one or more data wires, the air mover controller to receive mobile computing device temperature information over the one or more data wires, the air mover controller to control the flow rate of the forced air based on the mobile computing device temperature information.

Example 17 comprises the apparatus of Example 9, wherein the cable further comprises one or more data wires, the air mover controller to receive mobile computing device operational state information over the one or more data wires, the air mover controller to control the flow rate of the forced air based on the mobile computing device operational state information.

Example 18 comprises the apparatus of Example 9, wherein the cable further comprises one or more data wires, the air mover controller to receive information indicating an operating temperature of the mobile computing device and a critical temperature of the mobile computing device, the air mover controller to control the flow rate of the forced air based on a difference between the critical temperature of the mobile computing device and the operating temperature of the mobile computing device.

Example 19 comprises the apparatus of Example 9, wherein the cable further comprises one or more data wires, the air mover controller to receive information indicating an operating temperature of a mobile computing device component and a critical temperature of the mobile computing device component, the air mover controller to control the flow rate of the forced air based on a difference between the critical temperature of the mobile computing device component and the operating temperature of the mobile computing device component.

Example 20 comprises the apparatus of Example 9, wherein the cable further comprises one or more data wires, the air mover controller to receive user presence information over the one or more data wires, the air mover controller to control the flow rate of the forced air based on the user presence information.

Example 21 comprises the apparatus of Example 20, wherein the air mover controller is to increase the flow rate of the forced air if the user presence information indicates that a user is present at the mobile computing device.

Example 22 comprises the apparatus of any one of Examples 1-21, wherein the connector comprises: a first connector portion to connect the wires to the mobile computing device; and one or more second connector portions to connect the cooling channels to the mobile computing device.

Example 23 comprises the apparatus of any one of Examples 1-22, wherein the apparatus is a power adapter to convert an external power supply signal to an input power supply signal that is suitable for use by the mobile computing device.

Example 24 is a method comprising: providing forced air to a mobile computing device by an air mover via one or more cooling channels connected to the air mover and the mobile computing device; determining, by the air mover, a measure of current flowing through a power wire carried by a cable connected to the mobile computing device; and controlling, by the air mover, a flow rate of the forced air based on the measure of how much current is flowing through the power wire.

Example 25 comprises the method of Example 24, wherein the measure of current flowing through the power wire is a measure of current flowing through a current sensing resistor.

Example 26 is a method comprising: providing forced air to a mobile computing device by an air mover via one or more cooling channels connected to the air mover and the mobile computing device; receiving, by the air mover, mobile computing device performance information over one or more data wires carried by a cable connected to the mobile computing device; and controlling, by the air mover, a flow rate of the forced air based on the mobile computing device performance information.

Example 27 comprises the method of Example 26, wherein the mobile computing device performance information comprises mobile computing device power consumption information, the controlling the flow rate of the forced air based on the mobile computing device performance information comprises controlling the flow rate of the forced air based on the mobile computing device power consumption information.

Example 28 comprises the method of Example 26, wherein the mobile computing device performance information comprises mobile computing device current consumption information, the controlling the flow rate of the forced air based on the mobile computing device performance information comprises controlling the flow rate of the forced air based on the mobile computing device current consumption information.

Example 29 comprises the method of Example 28, wherein the mobile computing device current consumption information indicates an amount of current drawn by a charging circuit of the mobile computing device, the controlling the flow rate of the forced air based on the mobile computing device current consumption information comprises controlling the flow rate of the forced air based on the amount of current drawn by the charging circuit of the mobile computing device.

Example 30 comprises the method of Example 28, wherein the mobile computing device current consumption information indicates an amount of current drawn by an integrated circuit component of the mobile computing device, the controlling the flow rate of the forced air based on the mobile computing device current consumption information comprises controlling the flow rate of the forced air based on the amount of current drawn by the integrated circuit component of the mobile computing device.

Example 31 comprises the method of Example 26, wherein the mobile computing device performance information comprises mobile computing device temperature information, the controlling the flow rate of the forced air based on the mobile computing device performance information comprises controlling the flow rate of the forced air based on the mobile computing device temperature information.

Example 32 comprises the method of Example 26, wherein the mobile computing device performance information comprises information indicating an operating temperature of the mobile computing device and a critical temperature of the mobile computing device, the controlling the flow rate of the forced air based on the mobile computing device performance information comprising controlling the flow rate of the forced air based on a difference between the critical temperature of the mobile computing device and the operating temperature of the mobile computing device.

Example 33 comprises the method of Example 26, wherein the mobile computing device performance information comprises information indicating an operating temperature of a mobile computing device component and a critical temperature of the mobile computing device component, the controlling the flow rate of the forced air based on the mobile computing device performance information comprising controlling the flow rate of the forced air based on a difference between the critical temperature of the mobile computing device component and the operating temperature of the mobile computing device component.

Example 34 is a method comprising: providing forced air to a mobile computing device by an air mover via one or more cooling channels connected to the air mover and the mobile computing device; receiving, by the air mover, mobile computing device operational state information over one or more data wires carried by a cable connected to the mobile computing device; and controlling, by the air mover, a flow rate of the forced air based on the mobile computing device operational state information.

Example 35 is a method comprising: providing forced air to a mobile computing device by an air mover via one or more cooling channels connected to the air mover and the mobile computing device; receiving, by the air mover, user presence information over one or more data wires carried by a cable connected to the mobile computing device; and controlling, by the air mover, a flow rate of the forced air based on user presence information.

Example 36 comprises the method of Example 35, wherein controlling the flow rate of the forced air based on the user presence information comprises increasing the flow rate of the forced air if the user presence information indicates that no user is present at the mobile computing device.

Example 37 is a system comprising: a mobile computing device; a cable comprising a plurality of wires; one or more cooling channels external to the cable; an air mover connected to the one or more cooling channels, the air mover to generate forced air and provide the forced air to the cooling channels; and a connector located at an end of the cable to connect the wires and the cooling channels to a computing device.

Example 38 comprises the system of Example 37, wherein the system is passively cooled.

Example 39 is a system comprising: a mobile computing device; and a cooling means external to the mobile computing device to generate forced air and provide the forced air to the mobile computing device, a flow rate of the forced air based on performance or an operational state of the mobile computing.

Example 40 comprises the system of Example 39, wherein the system is passively cooled.

Example 41 is one or more computer-readable storage media storing computer-executable instructions that, when executed, cause an air mover to perform any one of the methods of Examples 24-36.

Example 42 is an apparatus comprising a means to perform any one of the method of Examples 24-36.

The invention claimed is:
1. An apparatus comprising:
 a cable comprising a plurality of wires, the cable having a first end and a second end;
 one or more cooling channels external to the cable;

an air mover connected to the one or more cooling channels, the air mover to generate forced air and provide the forced air to the cooling channels;

wherein the air mover is positioned at a point along the cable between the first end of the cable and the second end of the cable; and a connector located at the first end of the cable to connect the wires and the cooling channels to a mobile computing device.

2. The apparatus of claim 1, wherein the air mover is integrated into the cable.

3. The apparatus of claim 1, wherein the air mover is external to the cable.

4. The apparatus of claim 1, wherein the connector is a first connector and the air mover is connected to a power wire of the plurality of wires.

5. The apparatus of claim 1, wherein the cooling channels are internal to the cable.

6. The apparatus of claim 1, wherein the connector comprises a first connector portion that encloses the wires and one or more second connector portions that enclose the cooling channels, the one or more second connector portions releasably attachable to the first connector portion.

7. The apparatus of claim 1, further comprising an air mover controller to control a flow rate of the forced air generated by the air mover through the cooling channels.

8. The apparatus of claim 7, further comprising current sensing circuitry, the air mover controller to control the flow rate of the forced air based on a measure of how much current is flowing through a power wire of the plurality of wires provided by the current sensing circuitry.

9. The apparatus of claim 7, wherein the cable further comprises one or more data wires, the air mover controller to receive mobile computing device power consumption information over the one or more data wires, the air mover controller to control the flow rate of the forced air based on the mobile computing device power consumption information.

10. The apparatus of claim 7, wherein the cable further comprises one or more data wires, the air mover controller to receive mobile computing device current consumption information over the one or more data wires, the air mover controller to control the flow rate of the forced air based on the mobile computing device current consumption information.

11. The apparatus of claim 7, wherein the cable further comprises one or more data wires, the air mover controller to receive mobile computing device operational state information over the one or more data wires, the air mover controller to control the flow rate of the forced air based on the mobile computing device operational state information.

12. The apparatus of claim 7, wherein the cable further comprises one or more data wires, the air mover controller to receive information indicating an operating temperature of the mobile computing device and a critical temperature of the mobile computing device, the air mover controller to control the flow rate of the forced air based on a difference between the critical temperature of the mobile computing device and the operating temperature of the mobile computing device.

13. The apparatus of claim 7, wherein the cable further comprises one or more data wires, the air mover controller to receive information indicating an operating temperature of a mobile computing device component and a critical temperature of the mobile computing device component, the air mover controller to control the flow rate of the forced air based on a difference between the critical temperature of the mobile computing device component and the operating temperature of the mobile computing device component.

14. The apparatus of claim 1, wherein the apparatus is a power adapter to convert an external power supply signal to an input power supply signal that is suitable for use by the mobile computing device.

15. A system comprising:
a mobile computing device;
a cable comprising a plurality of wires, the cable having a first end and a second end;
one or more cooling channels external to the cable;
an air mover connected to the one or more cooling channels, the air mover to generate forced air and provide the forced air to the cooling channels;
wherein the air mover is positioned at a point along the cable between the first end of the cable and the second end of the cable; and
a connector located at the first end of the cable to connect the wires and the cooling channels to the mobile computing device.

16. The system of claim 15, wherein the system is passively cooled.

17. The system of claim 15, wherein the cooling channels are internal to the cable.

18. The system of claim 15, wherein the air mover is integrated into the cable.

19. The system of claim 15, further comprising an air mover controller to control a flow rate of the forced air generated by the air mover through the cooling channels.

20. The system of claim 19, wherein the cable further comprises one or more data wires, the air mover controller to receive mobile computing device power consumption information or mobile computing device operational state information over the one or more data wires, the air mover controller to control the flow rate of the forced air based on the mobile computing device power consumption information or the mobile computing device operational state information.

21. A system comprising:
a mobile computing device; and
a cooling means external to the mobile computing device to generate forced air and provide the forced air to the mobile computing device, a flow rate of the forced air based on performance or an operational state of the mobile computing device;
wherein the cooling means includes a cable having a first end and a second end, and
an air mover to generate the forced air; and
wherein the air mover is positioned at a point along the cable between the first end of the cable and the second end of the cable.

22. The system of claim 21, wherein the system is passively cooled.

* * * * *